United States Patent [19]

Frenkel et al.

[11] Patent Number: 4,763,225
[45] Date of Patent: Aug. 9, 1988

[54] HEAT DISSIPATING HOUSING FOR AN ELECTRONIC COMPONENT

[75] Inventors: Ferdinand Frenkel, Augsburg; Herbert Prussas, Reichertshausen; Lothar Rapp, Munich, all of Fed. Rep. of Germany

[73] Assignee: Siemens Aktiengesellschaft, Berlin and Munich, Fed. Rep. of Germany

[21] Appl. No.: 900,070

[22] Filed: Aug. 25, 1986

[30] Foreign Application Priority Data

Aug. 30, 1985 [DE] Fed. Rep. of Germany ....... 3531135

[51] Int. Cl.$^4$ .......................... H02B 1/00; H05K 7/20
[52] U.S. Cl. ..................................... 361/388; 361/389
[58] Field of Search ............... 361/386, 387, 388, 389, 361/381, 395

[56] References Cited

U.S. PATENT DOCUMENTS

| | | | |
|---|---|---|---|
| 3,328,642 | 6/1967 | Haumesser et al. | 361/387 |
| 4,394,679 | 6/1983 | Hawrylo | 357/81 |
| 4,415,025 | 11/1983 | Horvath | 361/386 |
| 4,612,601 | 9/1986 | Watari | 361/387 |

FOREIGN PATENT DOCUMENTS

| | | |
|---|---|---|
| 0097782 | 4/1983 | European Pat. Off. . |
| 0111264 | 12/1983 | European Pat. Off. . |
| 0137485 | 10/1984 | European Pat. Off. . |
| 0171051 | 8/1985 | European Pat. Off. . |
| 0172485 | 8/1985 | European Pat. Off. . |

OTHER PUBLICATIONS

IBM Bulletin, Kunkler et al., vol. 23, No. 9, Feb. 1981; pp. 4095-4096.
IBM Bulletin, Shott; vol. 20, No. 7, Dec., 1977; pp. 1635-2636.

Primary Examiner—Roy N. Envall, Jr.
Attorney, Agent, or Firm—James G. Morrow

[57] ABSTRACT

A heat dissipating housing (1, 4, 5, 6) with a tub (1, 4) and an outer cover (5, 6) seated on the tub (1, 4)—preferably hermetically tight—for an electronic circuit component (11, 17) which in operation gives off heat to be dissipated such as a light emitting diode (17) and/or a semiconductor driver chip (11) is disclosed. The circuit component (11, 17) is fastened on the bottom (1) of the tub (1, 4). In operation, the heat to be dissipated is to be transferred at least in considerable part via a heat removal body (5, 6) of the housing (1, 4, 5, 6) to an outer surface of the housing, preferably via a heat conducting outer cover (5, 6) serving as the heat removal body (5, 6) to the outer surface air, sweeping the housing. The dissipated heat removal to the cooling medium is improved by especially simple means in that at least a part of the inner surface of the bottom (1) as well as of the sidewalls (4) of the—on the whole—relatively poorly heat conducting tub (1, 4) is lined with at least one lining sheet (2) of good heat conduction, the lining sheet (2) having a transitional section of good heat conduction toward the circuit component (11, 17) as well as toward the heat removal body (5, 6).

11 Claims, 1 Drawing Sheet

HEAT DISSIPATING HOUSING FOR AN ELECTRONIC COMPONENT

BACKGROUND OF THE INVENTION

1. Technical Field

The invention relates to the field of heat-dissipating housings for electronic components that give off considerable heat.

2. Description of the Prior Art

It is the object of the invention to improve at little expense the cooling of an electronic circuit component applied on the bottom in the interior of the housing described in European Pat. No. 01374825 A2 when large portions of the housing, even the entire tub, are insufficiently heat-conducting to remove the heat created by the circuit component during operation, or at least a major portion thereof, to a circulating cooling medium. The heat-creating circuit component itself may be composed of several members disposed inside the housing discretely, namely, for example, a light emitting diode with a 1W power dissipation requirement and a driver chip having a similarly high power dissipation requirement as a high-frequency preamplifier for the light emitting diode. For the safe operation of such components, the two members must be cooled sufficiently. In this case, seen as a whole, insufficiently heat-conducting materials are applied for large parts of the housing which present considerable difficulties, for example, special steel, chosen for reasons of corrosion protection, for the bottom or for the entire tub. Especially when a plurality of such housings are mounted on a circuit board packed close together, cooling is possible essentially only via the outer cover. In addition, the measures according to the invention are to create also a considerable thermal dissipation capacity near enough to the circuit component to absorb brief, very high power, dissipation requirement peaks.

These problems of the prior art are solved in accordance with an aspect of the invention by lining the tubs with a lining sheet having a good heat transitional section toward the component and the cover.

In accordance with another aspect of the invention, manufacturing cost is reduced. In accordance with a further aspect of the invention, a low heat transfer resistance is achieved under difficult conditions between the circuit component—or a member thereof—and the lining sheet, preferably the bottom region thereof. Moreover, a small heat transfer resistance between the lining sheet and the outer cover even in mass production and at low cost can be achieved, despite large manufacturing tolerances for an inner cover. In accordance with yet another aspect of the invention, partitions are utilized for improving the cooling and at the same time for shielding between different members of the circuit components. In accordance with still another aspect of the invention, the heat transfer resistance between the lining sheet and the outer cover is minimized without having to adhere to narrow manufacturing tolerances for the lining sheet or for the outer cover.

The invention and its developments will be explained further with reference to two figures.

DETAILED DESCRIPTION

Figure 1:
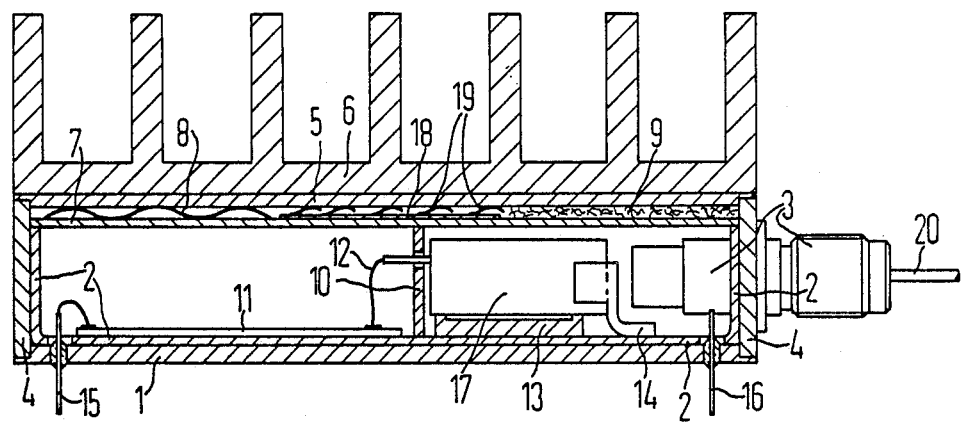
FIG. 1 shows a vertical section through an exemplary embodiment of the invention seen from the side and containing an optoelectronic transducer, and FIG. 2, on a larger scale, a detail of a variant housing, in top view.

FIG. 1 shows an example of a housing 1, 4, 5, 6 of metal but relatively poor heat conduction, which contains a boat or tub 1, 4 with bottom 1 and sidewalls 4, as well as an outer cover preferably secured hermetically tight on the tub 1, 4. The outer cover comprising a plate 5 and a cooling fin part 6 which may be screwed to plate 5. In the housing, a component 11, 17 is mounted which in operation gives off heat to be dissipated and which comprises, for example, an infrared light emitting diode 17 and a connected semiconductor driver chip 11, that is, as shown here, by two separate members 11 and 17. In the example shown, the circuit component 11, 17 serves as an optoelectronic transducer of an optoelectronic communications system in which the circuit component 11, 17, or respectively its individual members 11 and 17, mounted on the bottom 1 of the tub are to be operated near their highest permissible operating temperature and must be carefully cooled by purposeful measures.

The housing further contains the electric supply leads, of which the figure shows symbolically only one lead 12 between the two members 11 and 17 and two other leads, namely lead 15 to the driver chip 11 and lead 16 to the diode 17, each lead being insulated from the metal bottom 1. The housing further contains the end of a glass fiber 20 with its fiber connector 3 for the outward conduction of light.

The circuit component 11, 17, here consisting essentially of two members 11 and 17, is mounted on the bottom 1 of tub 1, 4, each member being mounted separately. The dissipated heat is to be given off largely via the heat-conducting outer cover 5, 6 for conducting heat to the outer surface thereof, and thence to the cooling air sweeping the housing. The tub 1, 4 of this example consists of a relatively poor heat conducting material, so the normal process of transferring the heat from the circuit component, here its two members 11 and 17, to the cooling air is insufficient, especially when at least one of the two members is operated close to its highest permissible operating temperature. The tub thus may consist of special steel with a heat conductivity of only 15 W/m.K or of FeNi or FeNiCo alloys (Vacodil or Vacon) having a conductivity between 10 and 16.7 W/m.K.

Actually, for improving the heat transfer, it is possible to carry out also other measures such as measures described in the older European patent application No. 0 171 051 A1 as well as in the measures described in the co-pending and concurrently filed U.S. patent application Ser. No. 900,111 with the same priority, and in U.S. patent application Ser. No. 762,514 filed Aug. 5, 1985 which corresponds to European patent application No. 0 172 485 A1.

The invention relates to still another possible measure. According to the invention, returning to FIG. 1, at least a portion of the inner surface of the bottom 1 as well as of the sidewalls 4 of tub 1, 4 is lined with a heat-conducting sheet 2, for example, of copper having a conductivity of 385 W/m.K. Preferably the lining sheet itself is also tub-shaped and may have recesses for leads 15, 16, and, at the top toward the outer cover 5, 6, a planar edge, which can serve as a planar bearing surface as shown in FIG. 1. Such a construction of the housing also produces a high heat transfer capacity near the circuit component, requires little expense, and therefore is suitable for mass production, especially if the lining sheet 2 is inserted into the tub 1, 4 as a separate solid prefabricated housing part. Advantageously copper and special steel have very similar coefficients of linear thermal expansion (Cu, $17.7 \times 10^{-6} K^{-1}$ and CrNi steel, $16 \times 10^{-6} K^{-1}$), so that over wide temperature ranges of from $-40°$ to $+125°$ C. the lining sheet adheres firmly and uniformly to the boat 1, 4.

The two transitional sections may be different in construction. Referring to FIG. 1, a construction of the housing has been found to be especially favorable and low-cost in which the circuit component, here the driver chip 11, is mounted directly on a lining sheet section lying between circuit component 11 and bottom 1.

Alternatively, there may be inserted, if needed, between the circuit component, here the light emitting diode, and the lining sheet 2 a solid heat-conducting bridge 13, 14 serving as a transitional section. Bridge 13 serves as a pedestal for the respective component/member 11 while support 14 serves as a heat-removing lateral fishplate.

Low heat transfer resistance and large dimensional tolerances can be achieved for the parts in the transitional section to the heat-transfer body 5, 6 formed by the outer cover 5, 6 by the fact that near-to-the-cover surfaces of lining sheet 2 bearing surface for a heat conducting inner cover 7, the inner cover 7 and a spring member 8, 9, 18, 19 forming a further transitional section in that a highly elastic heat-conducting spring element 8, 9, 18, 19 is provided between the inner cover 7 and the inner surface of the outer cover 5, 6.

The inner cover 7 preferably consists of highly elastic material such as a CuNiBe alloy, so that it will apply on the lining sheet 2 over a large area and with low heat transfer resistance.

The spring element 8, 9, 18, 19 can be produced in different ways. It may, for instance, have the form of a corrugated sheet 8 made of a heat conducting spring plate of a CuNiBe alloy with 230 W/m.K heat conductivity.

Figure 2:
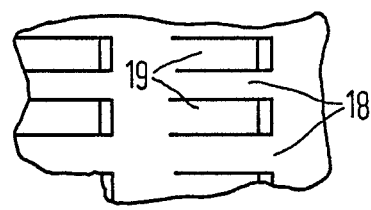

The spring element will have a still lower heat resistance if it is made of a spring plate 18, as shown in both FIGS. 1 and 2, in which are stamped feather tongues 19 of high bending and torsional elasticity which hug the bearing surface on the inner surface of the outer cover plate 5 or, if needed, also the respective outer surface of the inner cover 7 with high bearing pressure. Also this feather tongue spring plate 18, 19 may be made of high heat-conducting, highly elastic CuNiBe alloy.

Alternatively, the spring element may be made of a felt 9 of metal filaments, preferably of copper, such felt being easy to cut to the desired dimension and easy to insert in the housing.

If the circuit component consists of several members to be high frequency shielded from each other such as members 11 and 17 in FIG. 1, one can fit into the lining sheet 2 a partition 10 of heat conducting material for the formation of several chambers in the interior of the housing which are electrically shielded from each other, permitting the utilization of a partition 10 thus inserted for heat transfer from the bottom of lining sheet 2 to the outer cover 5, 6 - or respectively via the inner cover 7, as well.

If, as in the example shown, the housing contain several members of the circuit component, several different lining sheets can be provided in the housing, each being respectively connected for heat conduction with a part of the member and being connected for heat conduction via their own heat conduction elements to their own housing surfaces. It is then possible that the several individual lining sheets can have different operating temperatures, owing to which also the operating temperatures of the individual members of the circuit component can be selected differently. This arrangement of several lining sheets, which are then interconnected without good heat conduction between them is especially favorable when each of the members is to be operated separately up to close to its highest permissible operating temperature, although all these members and all their lining sheets are disposed in the same, single housing.

Thus there has been described a novel application of a lining sheet or several lining sheets and other measures promoting heat dissipation in an electronic component housing, to which measures one ordinarily skilled in the art world be able to add still further exemplary embodiments, the scope of the present invention only being limited by the claims which follow.

What is claimed is:

1. A heat dissipating housing surrounded by a cooling medium, said housing comprising:
    a tub defining an opening and a bottom for containing at least one circuit component which in operation gives off heat to be dissipated, wherein the circuit component is mounted on the bottom of the tub, the bottom defining an inner surface and the sidewalls are made of relatively poor heat conducting material;
    a heat-conducting outer cover defining an outer surface for transferring heat to the cooling medium, the outer cover being positioned on the opening of the tub; and
    at least one heat-conducting lining sheet, the lining sheet having a relatively good heat conduction toward the circuit component as well as toward the heat-conducting outer cover, wherein a substantial portion of the heat to be dissipated is transferred by the lining sheet from the circuit component to the outer cover.

2. The heat dissipating housing according to claim 1, wherein said at least one circuit component is a light emitting diode.

3. This heat dissipating housing according to claim 1, wherein said at least one circuit component is a semiconductor driver chip.

4. The heat dissipating housing according to claim 1, wherein said cooling medium is air.

5. The heat dissipating housing according to claim 1 wherein the lining sheet is insertable as a separate solid housing component into the tub of the housing.

6. The heat dissipating housing according to claim 1, wherein the circuit component is mounted directly on the lining sheet, the lining sheet section lying between the circuit component and the bottom of the tub.

7. The heat dissipating housing according to claim 1, further comprising a solid heat conducting bridge for conducting heat between the circuit component and the lining sheet.

8. The heat dissipating housing according to claim 1, further comprising:
    a heat conducting inner cover, wherein the lining sheet defines a heat conduction bearing surface for supporting the inner cover and conducting heat to the inner cover; and a heat conducting spring element for conducting heat from the inner cover to the outer cover, the spring element being positioned between the inner cover and outer cover.

9. The heat dissipating housing according to claim 8, wherein the spring element is stamped from a sheet and has feather tongues (19) for conducting heat between the inner cover and the outer cover.

10. The heat dissipating housing according to claim 1, wherein said lining sheet has at least one partition of good heat conducting material forming at least two chambers in the interior of the housing electrically shielded at high frequencies from one another.

11. The heat dissipating housing according to claim 1, wherein a plurality of thermal lining sheets are provided connected with one another with poor heat conduction, each lining sheet being connected with its own members of said at least one circuit component with good heat conduction, the members of the circuit component being respectively connected with different lining sheets with good heat conduction but connected with one another with poor heat conduction, and each of the lining sheets being connected with respective outer surfaces of the housing with good heat conduction.

* * * * *